United States Patent
Fritz et al.

(10) Patent No.: US 7,361,976 B2
(45) Date of Patent: Apr. 22, 2008

(54) DATA CARRIER WITH A MODULE WITH A REINFORCEMENT STRIP

(75) Inventors: Reinhard Fritz, Graz (AT); Peter Schmallegger, Bangkok (TH); Somnuk Akkahadsi, Bangkok (TH)

(73) Assignee: NXP B.V., Eindhoven (NL)

( * ) Notice: Subject to any disclaimer, the term of this patent is extended or adjusted under 35 U.S.C. 154(b) by 448 days.

(21) Appl. No.: 10/534,165

(22) PCT Filed: Oct. 31, 2003

(86) PCT No.: PCT/IB03/04913

§ 371 (c)(1),
(2), (4) Date: May 5, 2005

(87) PCT Pub. No.: WO2004/044834

PCT Pub. Date: May 27, 2004

(65) Prior Publication Data

US 2006/0159897 A1    Jul. 20, 2006

(30) Foreign Application Priority Data

Nov. 12, 2002 (EP) ................... 02102557

(51) Int. Cl.
    H01L 23/495    (2006.01)
    B32B 3/00      (2006.01)
(52) U.S. Cl. ............. 257/666; 257/676; 257/734; 257/735; 257/736; 257/753; 257/E23.035; 428/209

(58) Field of Classification Search ........ 257/666–677, 257/E23.031–E23.059, 678–753, 773–796, 257/E23.001–E23.194; 438/111, 112, 123, 438/FOR. 366, FOR. 367, FOR. 377, FOR. 380; 428/209, 643–685
See application file for complete search history.

(56) References Cited

U.S. PATENT DOCUMENTS

| 5,005,282 A | 4/1991 | Rose |
| 5,703,399 A * | 12/1997 | Majumdar et al. .......... 257/723 |
| 7,166,914 B2 * | 1/2007 | DiStefano et al. .......... 257/713 |
| 2007/0176287 A1 * | 8/2007 | Crowley et al. ............ 257/728 |

FOREIGN PATENT DOCUMENTS

WO    WO 00 72253    11/2000

* cited by examiner

Primary Examiner—Jasmine Clark
(74) Attorney, Agent, or Firm—Peter Zawilski

(57) ABSTRACT

In a lead-frame configuration (60), a module (70) and a data carrier (72), two connecting plates (12, 13) of the module (70), which are each intended for connection to a connecting contact or bump (47, 48) of a chip (41), are connected to a reinforcement film (66, 71) formed from a fiber-reinforced film of plastics material by means of a layer (73) of an adhesive that is particularly well suited to transmitting shear forces, in which case there is additionally provided in an advantageous further embodiment, on the reinforcement film (66, 71), at least one further layer (74, 75, 76) that is able to serve for protecting, damping or fastening purposes.

14 Claims, 4 Drawing Sheets

DATA CARRIER WITH A MODULE WITH A REINFORCEMENT STRIP The invention relates to a lead-frame configuration that is strip-like in form, that has a frame base and that has a plurality of lead-frames that are connected to the frame base and are situated next to one another in the longitudinal direction of the strip, each of which lead-frames is intended to receive a chip, wherein each lead-frame has at least two connecting plates, wherein there is provided for the lead-frames that are situated next to one another in the longitudinal direction of the lead-frame strip a reinforcement strip that extends in the longitudinal direction of the strip and is connected both to the frame base and to the connecting plates of each of the lead-frames that are situated next to one another in the longitudinal direction of the lead-frame strip, the connection being made by means of a layer of adhesive.

The invention further relates to a module that is produced with the help of a lead-frame configuration and that has at least two connecting plates each of which is connected to a connecting contact or bump of a chip, and that has a reinforcement ribbon that is connected to the connecting plates, the connection being made with a layer of adhesive.

The invention further relates to a data carrier fitted with a module.

A lead-frame configuration of this kind, a module of this kind and a data carrier of this kind are known from U.S. Pat. No. 5,005,282 A. In these known designs, the reinforcement strip comprises a film of plastics material that was marketed under the "KAPTON" trademark and the layer of adhesive comprises an adhesive material that was marketed under the "PYRALUX" trademark. The reinforcement strip is a simple fiber-free plastics film and the adhesive is an ordinary adhesive, and although relatively good mechanical reinforcement is obtained in this way by means of the reinforcement strip that is connected to the connecting plates via the layer of adhesive, it has been found that the known solution does not provide sufficiently great mechanical reinforcement when there are high mechanical loads on a module or on a data carrier having such a module, or in other words, that the known design merits improvement.

It is an object of the invention to provide a solution for the factors meriting improvement that have been specified above and to produce an improved lead-frame configuration, an improved module and an improved data carrier.

To allow the above object to be achieved, there are provided in a lead-frame configuration according to the invention features according to the invention, thus enabling a lead-frame configuration according to the invention to be characterized as follows, namely:

A lead-frame configuration that is strip-like in form, that has a frame base and that has a plurality of lead-frames that are connected to the frame base and that are situated next to one another in the longitudinal direction of the strip, each of which lead-frames is intended to receive a chip, wherein each lead-frame has at least two connecting plates, wherein there is provided for the lead-frames that are situated next to one another in the longitudinal direction of the strip a reinforcement strip that extends in the longitudinal direction of the strip and is connected both to the frame base and to the connecting plates of each of the lead-frames that are situated next to one another in the longitudinal direction of the strip, the connection being made by means of a layer of adhesive, wherein the reinforcement strip is formed by a fiber-reinforced film of plastics material and wherein the layer of adhesive is produced by means of an adhesive that is suitable for transmitting shear forces that may possibly occur in the region between the connecting plates on the one hand and the reinforcement strip on the other hand.

To allow the above object to be achieved, there are provided in a module according to the invention features according to the invention, thus enabling a module according to the invention to be characterized as follows, namely:

A module that is produced with the help of a lead-frame configuration and that has at least two connecting plates each of which is connected to a connecting contact or bump of a chip, and that has a reinforcement ribbon that is connected to the connecting plates, the connection being made by means of a layer of adhesive, wherein the reinforcement ribbon is formed by a fiber-reinforced film of plastics material and wherein the layer of adhesive is produced by means of an adhesive that is suitable for transmitting shear forces that may possibly occur in the region between the connecting plates on the one hand and the reinforcement ribbon on the other hand.

To allow the above object to be achieved, there are provided in a data carrier according to the invention features according to the invention, thus enabling a data carrier according to the invention to be characterized as follows, namely that a data carrier according to the invention contains a module according to the invention.

By the provision of the features according to the invention, there is obtained, in a manner which is structurally simple and also inexpensive, a mechanical reinforcing function that is appreciably improved over the known solutions, the reason for this being that considerably higher mechanical forces can be withstood by a fiber-reinforced film of plastics material, it being ensured by means of the adhesive intended to connect the fiber-reinforced film of plastics material to the connecting plates, which adhesive is particularly well suited to transmitting shear forces that may possibly occur in the region between the connecting plates on the one hand and the reinforcement strip on the other hand, that tensile or thrust forces that act on the connecting plates and that operate as shear forces as mentioned above are transmitted to the reinforcement strip or reinforcement ribbon of fiber-reinforced film of plastics material without any adverse deformation of the layer of adhesive, thus enabling the fiber-reinforced film of plastics material, which is able to take high mechanical loads, to withstand the whole of such forces, thus ensuring that there cannot be any local displacements of the connecting plates relative to the connecting contacts of the chip, which means that it is at all times ensured that the electrical and mechanical connections between the connecting plates and the connecting contacts of the chip are protected against high mechanical loads and that safe mechanical and electrical contact between the connecting plates and the connecting contacts of the chip is ensured at all times. The advantages outlined above are particularly important when a lead-frame configuration according to the invention or a module according to the invention is intended for the manufacturer of a data carrier and is used for this purpose and when a data carrier of this kind is a label or tag that is intended for example for marking products and is therefore connected to such products, because labels or tags of this kind may be subjected to high bending stresses, in which case high forces may then be exerted on the mechanical and electrical connections between the connecting plates and the connecting contacts of the chip.

In the case of the solutions according to the invention, it has proved advantageous if at least one further layer is provided on the reinforcement strip or reinforcement ribbon formed by a fiber-reinforced film of plastics material. It has proved particularly advantageous in this case if there is provided on the reinforcement strip or reinforcement ribbon formed by a fiber-reinforced film of plastics material at least one further layer that belongs to the group of layers detailed below, which group comprises: a protective layer that is composed of metal, a damping layer that is composed of a damping material and preferably of a paper-like material, and a fastening layer that is composed of a fastening material and preferably of an adhesive material. What is additionally achieved in this way, in a simple and inexpensive manner, is that an additional protective function and, if required, a damping function and a fastening function are obtained.

These and other aspects of the invention are apparent from and will be elucidated with reference to the embodiments described hereinafter.

IN THE DRAWINGS

Figure 1:
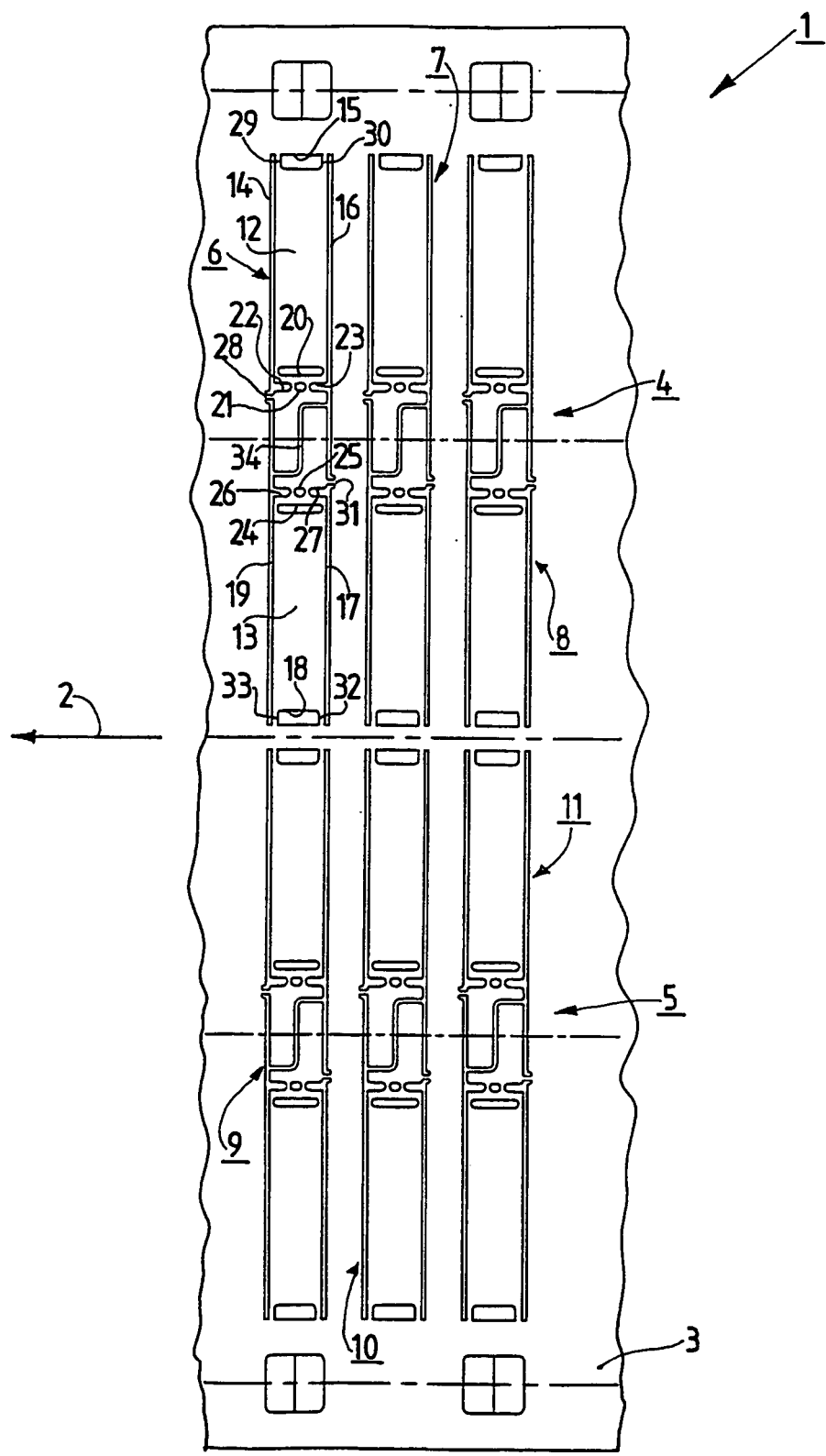
FIG. 1 is a plan view from above showing part of a lead-frame configuration according to one embodiment of the invention, in which lead-frame configuration no chips have, as yet, been connected to the lead-frames that it is shown to have.

Part of a lead-frame configuration 1 is shown in FIG. 1. The lead-frame configuration 1 is strip-like in form and extends in a longitudinal direction that is indicated in FIG. 1 by an arrow 2. The lead-frame configuration 1 has a frame base 3. Connected to the frame base 3 are a plurality of lead-frames that are situated next to one another in the longitudinal direction 2 of the strip. The lead-frames are arranged in two rows 4 and 5 in the present case. Of the total number of lead-frames provided only six, 6, 7, 8, 9, 10 and 11, are shown in FIG. 1, in which case lead-frames 6, 7 and 8 make up the first row 4 and lead-frames 9, 10 and 11 make up the second row 5. Each lead-frame 6 to 11 is intended to receive a chip in this case. However, in the case of the lead-frame configuration 1 shown in FIG. 1, the chips have not yet been connected to the lead-frame configuration 1 or rather to the lead-frames 6 to 11 belonging to this lead-frame configuration 1.

The design of all the lead-frames 6 to 11 will be described in detail below, although this description will be given by reference only to the first lead-frame mentioned, 6.

Each lead-frame 6 to 11, and hence lead-frame 6 too, has two connecting plates 12 and 13. The connecting plates 12 and 13 are separated from the frame base 3 by a first narrow air-gap 14, a first aperture 15, a second narrow air-gap 16, a third narrow air-gap 17, a second aperture 18 and a fourth narrow air-gap 19. Provided in the first connecting plate 12 are one complete elongated hole 20 and, adjacent thereto, a hole 21 and two half elongated holes 22 and 23, with the first half elongated hole 22 opening into the first narrow air-gap 14 and the second half elongated hole 23 opening into the second narrow air-gap 16. In the second connecting plate 13, there are likewise provided one complete elongated hole 24 and, adjacent thereto, a hole 25 and two half elongated holes 26 and 27, of which the first half elongated hole 26 opens into the fourth narrow air-gap 19 and the second half elongated hole 27 opens into the third narrow air-gap 17. What is achieved by the provision of the narrow air-gaps 14, 16, 17 and 19 and the apertures 15 and 18 is that there are a total of three connecting bridges 28, 29 and 30 between the first connecting plate 12 and the frame base 3, by means of which both a mechanical and an electrically conductive connection is made between the first connecting plate 12 and the frame base 3. In a similar way, there are three further connecting bridges 31, 32 and 33 provided between the second connecting plate 13 and the frame base 3, by means of which both a mechanical and an electrically conductive connection is made between the second connecting plate 13 and the frame base 3. Each of the two connecting plates 12 and 13 is intended to be connected to a chip connection or bump of a chip.

The two connecting plates 12 and 13 of the lead-frame 6 define a bridging zone 34 that can be bridged by means of a chip. In the case of the lead-frame configuration 1, the arrangement made is, with particular advantage, such that the two connecting plates 12 and 13 of lead-frame 6, and hence of all the other lead-frames 7, 8, 9, 10 and 11 too, are directly adjacent to one another, without any section of the lead-frame 6 or, in the other cases, of the other lead-frames 7 to 11, intervening, and define a narrow air-gap 34 as a bridging zone 34. In the present design, the air-gap 34 is arranged to extend obliquely to the longitudinal direction 2 of the strip. This being the case, the air-gap 34 is arranged to extend substantially in an S-shape, as can be seen in FIG. 1.

Figure 2:
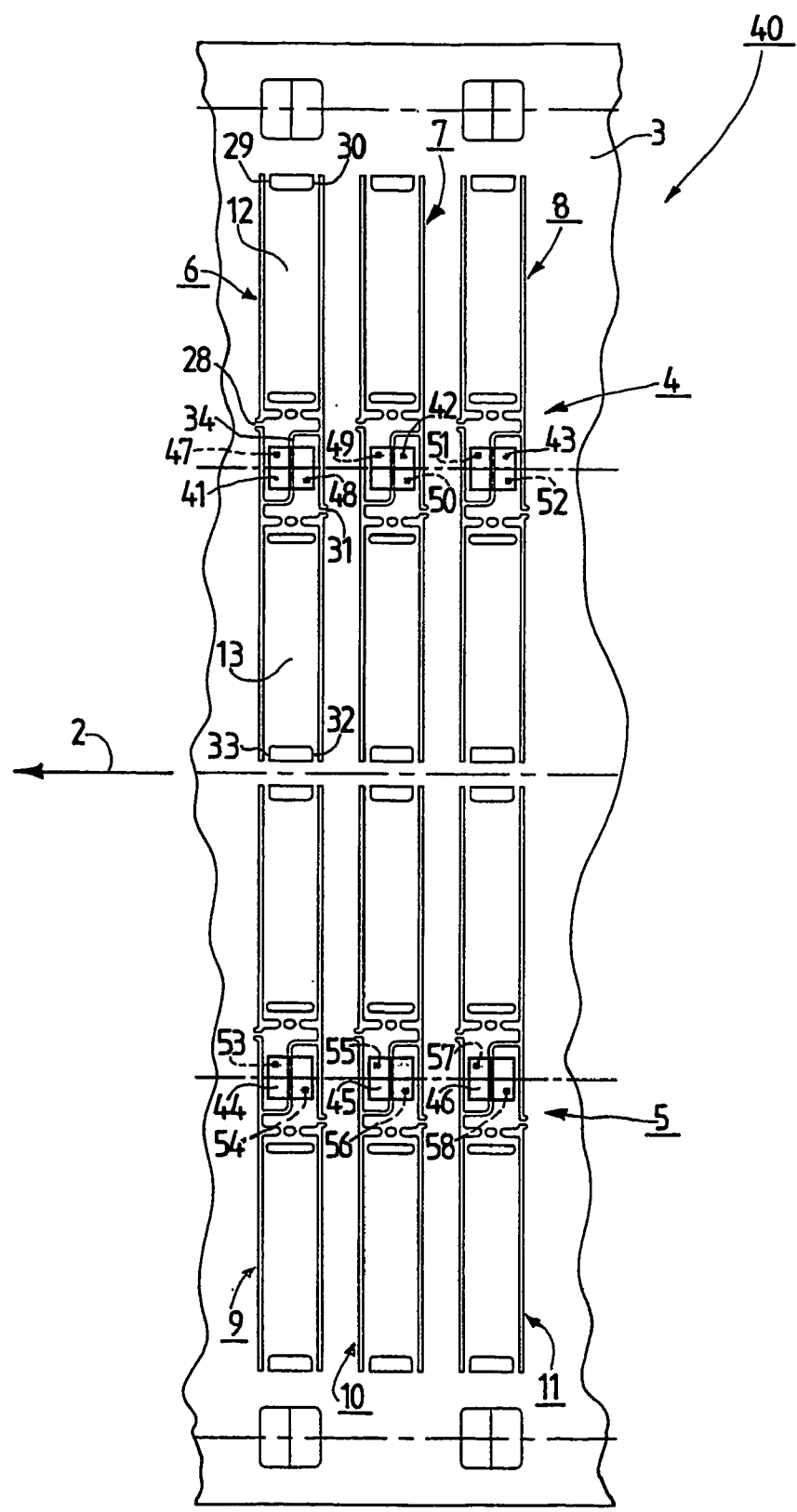
FIG. 2 shows, in a similar way to FIG. 1, part of a lead-frame configuration according to one embodiment of the invention, in which lead-frame configuration a chip has already been connected to the lead-frames that it is shown to have and the lead-frames are still electrically connected to the frame base.

Shown in FIG. 2 is a lead-frame configuration 40 that is obtained by applying further processing to the lead-frame configuration 1 shown in FIG. 1 and that differs from the lead-frame configuration 1 shown in FIG. 1 in that in the lead-frame configuration 40 shown in FIG. 2 there is a chip 41, 42, 43, 44, 45, 46 connected to each lead-frame 6 to 11. The connection of each chip 41 to 46 to its lead-frame 6 to 11 is performed in this case by a so-called "flip-chip technique", which means that each chip 41 to 46 has been turned over or flipped and, in that position, has been set down on each pair of connecting plates 12 and 13 in each lead-frame 6 to 11 by its chip connections or bumps, of which there are two in the present case, 47, 48 and 49, 50 and 51, 52 and 53, 54 and 55, 56 and 57, 58, and has been connected thereto by an electrically conductive connection. The connection between the chip connections or bumps 47 to 58 and the connecting plates 12 and 13 in each lead-frame 6 to 11 is made in the present case by a thermal compression process. The connection between the chip connections or bumps 47 to 58 and the connecting plates 12 and 13 in each lead-frame 6 to 11 may of course also be made in the present case by any other process that is known per se.

Figure 3:
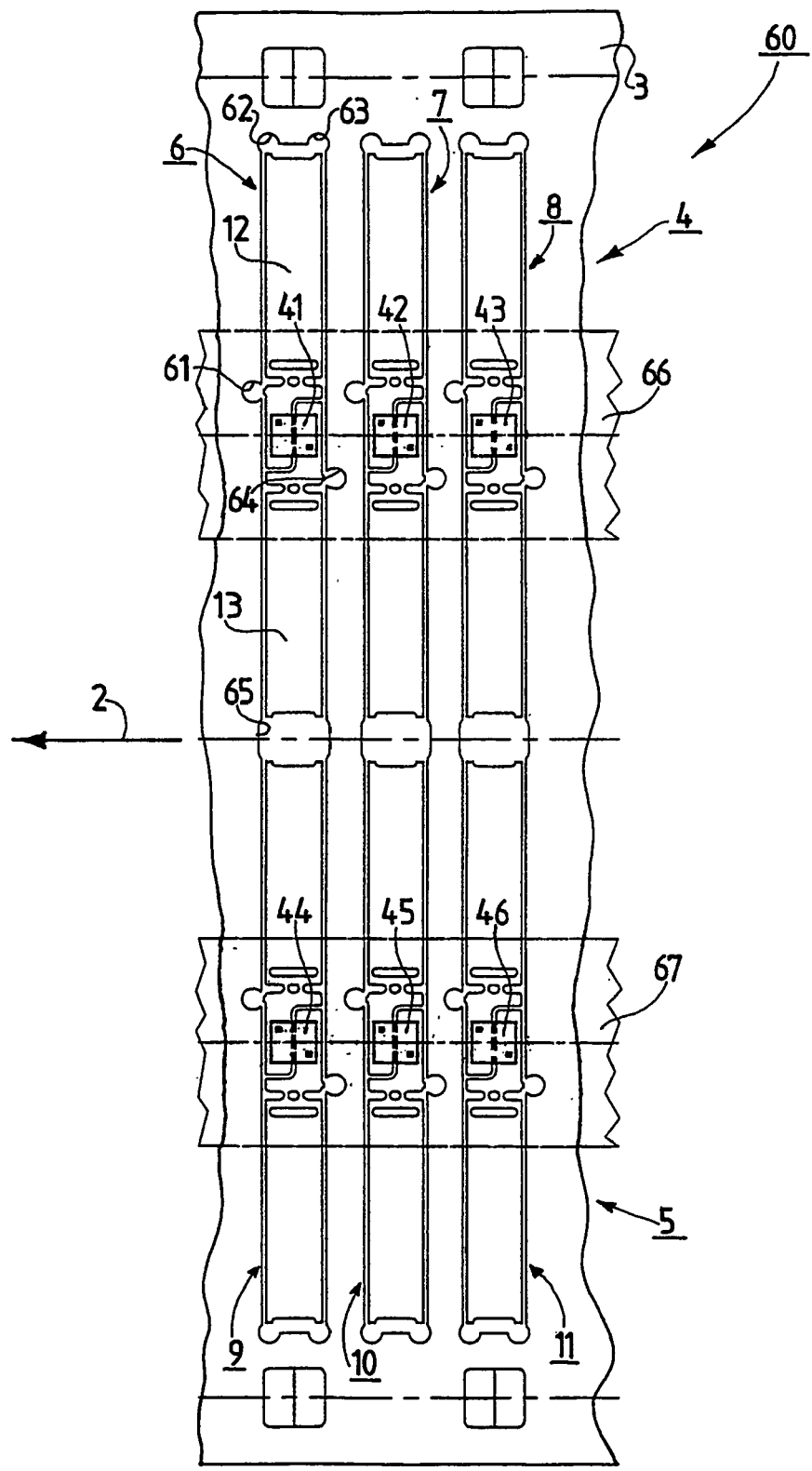
FIG. 3 shows, in a similar way to FIGS. 1 and 2, a lead-frame configuration according to one embodiment of the invention, in which lead-frame configuration a chip has already been connected to the lead-frames that it is shown to have and the lead-frames have been electrically isolated from the frame base.

Shown in FIG. 3 is a further lead-frame configuration 60 that is obtained by applying further processing to the lead-frame configuration 40 shown in FIG. 2 and that differs from the lead-frame configuration 40 shown in FIG. 2 in that the lead-frames 6 to 11 and the chips 41 to 46 connected to the said lead-frames 6 to 11 have been electrically isolated from the frame base 3. This is achieved by putting the connecting bridges that were originally provided between the connecting plates 12 and 13 and the frame base 3 out of action, so doing by now providing in those regions in which the above-mentioned connecting bridges 28 to 33 were provided apertures 61, 62, 63, 64, 65 produced by a stamping or punching process.

If the apertures 61 to 65 were made without any prior precautions, it would result in the two connecting plates 12 and 13 in each lead-frame 6 to 11, together with the chips 41 to 46 that are connected to the two connecting plates 12 and 13, no longer having any mechanical connection to the frame base 3, which would mean that the two connecting plates in each lead-frame 6 to 11 and the chips 41 to 46 connected thereto would drop out of the frame base 3. To stop this from happening, there are provided in the lead-frame configuration 60 two reinforcement strips 66 and 67 extending in the longitudinal direction 2 of the lead-frame strip. The two reinforcement strips 66 and 67 are connected both to the frame base 3 and to each lead-frame 6 to 11, this being done in each case by a layer of adhesive that cannot be seen in FIG. 3. The connection of the two reinforcement strips 66 and 67 to the frame base 3 and to the lead-frames 6 to 11 can be performed by bonding on the reinforcement strips 66 and 67 by means of the layer of adhesive. The connection of the two reinforcement strips 66 and 67 to the frame base 3 and to the lead-frames 6 to 11 may preferably be performed by a lamination process in which, as is known, a connection is made by applying pressure and, if required, heat to heat up the adhesive. It should be mentioned at this point that the connection of the two reinforcement strips 66 and 67 to the frame base 3 and to the lead-frames 6 to 11 can be performed before the chips 41 to 46 are connected to the lead-frames 6 to 11, which has the advantage that the chips 41 to 46 are then not exposed to any mechanical loads caused by the connection of the reinforcement strips 66 and 67 to the frame base 3 and to the lead-frames 6 to 11.

By virtue of the fact that in the lead-frame configuration 60 shown in FIG. 3 there is no longer any electrically conductive connection between the connecting plates 12 and 13 in each lead-frame 6 to 11 and the frame base 3, a testing operation can now be performed. In a testing operation of this kind, a contact electrode belonging to a testing device is brought into electrically conductive contact with each connecting plate 12 and 13, following which a test can be performed on the chips 41 to 46 connected to the connecting plates 12 and 13 by means of the testing device.

The lead-frame configuration 60 shown in FIG. 3 can be passed on for further processing on completion of the requisite testing procedure. The lead-frame configuration 60 in FIG. 3 may, for example, be passed on by the manufacturer of the said lead-frame configuration 60 to a manufacturer of chip cards that communicate without physical contact or to a manufacturer of RF tickets, RF tags or RF labels that operate by non-contacting means. The lead-frame configuration 60 shown in FIG. 3 is advantageously passed on in a so-called reel form, which is particularly advantageous with regard to transportation that is as easy and efficient as possible.

At the company at which the lead-frame configuration 60 is subjected to further processing, the connecting plates 12 and 13 plus the chips 41 to 46 are separated from the frame base 3 and the reinforcement strips 66 and 67 are cut, in each of which cases a unit comprising two connecting plates 12 and 13, a chip 41 to 46 and a reinforcement ribbon is obtained, which unit is referred to in specialist circles as a module. A module of this kind is inserted or introduced into the end product to be manufactured. In the continuing sequence, the connecting plates 12 and 13 of each module are then connected, for example, to the two connecting contacts of a transmission coil forming part of the given end product. Once the connecting plates 12 and 13 have been connected in this way, for example, to the connecting contacts of the transmission coil, the given end product is obtained, which in this case is a data carrier suitable for non-contacting communication performed by means of the transmission coil.

A module 70 as mentioned above is shown in FIG. 4. The module 70 has the two connecting plates 12 and 13 and the chip 41. The module 70 is also provided with a reinforcement ribbon 71 that has been obtained from the cut reinforcement strip 66 and that is connected to the connecting plates 12 and 13, being so connected via a layer of adhesive that can be seen neither in FIG. 3 nor FIG. 4.

Figure 5:
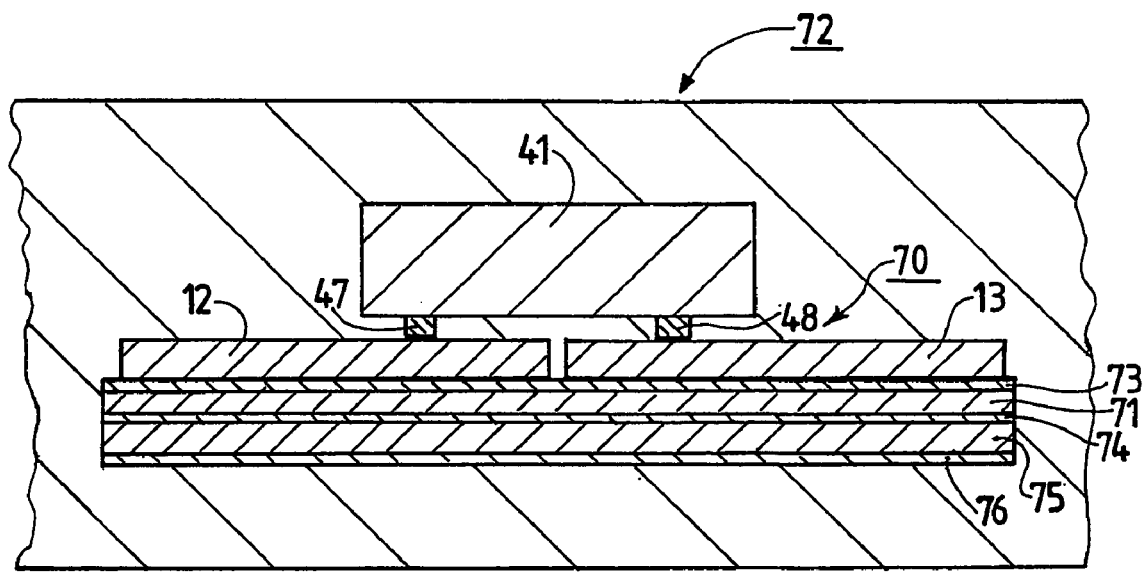
FIG. 5 is a section on line V-V showing, to a very much enlarged scale, a part of the module 70 shown in FIG. 4, in a state in which it is held in a data carrier.

FIG. 5 shows the module 70, which module 70 is held in a data carrier 72 of which only part is shown. The data carrier 72 is a so-called chip card in the present case. The data carrier 72 may also be what is termed a label or tag however. As can be seen from FIG. 5, the chip 41 has been connected to the two connecting plates 12 and 13 by the flip-chip technique, in which the chip connections 47 and 48, which are also referred to in specialist circles as bumps, have been connected to the two connecting plates 12 and 13 by a thermal compression process.

What can also be seen from FIG. 5 are the reinforcement ribbon 71 and the layer 73 of adhesive that is provided between the reinforcement ribbon 71 and the two connecting plates 12 and 13. In the case of the module 70 shown in FIG. 4, which was produced using the lead-frame configuration 60 shown in FIG. 3, only the reinforcement ribbon 71 and the layer 73 of adhesive are provided.

In the case of the module 70 or data carrier 72, the arrangement is advantageously such that the reinforcement ribbon 71 is formed by a fiber-reinforced film of plastics material. It is also particularly advantageous for the arrangement to be such that the layer 73 of plastics material is produced from an adhesive that is well suited to transmitting shear forces that may possibly occur in the region between the connecting plates 12 and 13 on the one hand and the reinforcement ribbon 71 on the other hand. A fiber-reinforced film 71 of this kind is preferably produced with the help of glass fibers. The adhesive is an adhesive that is resistant to shear forces and that thus cannot be elastically deformed by such shear forces.

What is advantageously achieved by the provision of the reinforcement ribbon 71 made from a fiber-reinforced film of plastics material and by the provision of the layer 73 of adhesive having the above-mentioned property is that tensile or thrust forces that may possibly be exerted on the two connecting plates 12 and 13, which forces produce shear forces between the two connecting plates 12 and 13 and the reinforcement ribbon 71, are transmitted by means of the layer 73 of plastics material directly to the reinforcement ribbon 71 with no loss of force and are withstood by the reinforcement ribbon 71, without this causing any deformation of the reinforcement ribbon 71 or the layer 73 of adhesive, thus reliably ensuring that no undesirably high forces can be exerted on the connections between the chip connections or bumps 47 and 48 on the one hand and the connecting plates 12 and 13 on the other hand, which means that these connection are very well protected. This is a great advantage particularly when the module 70 is used in a data carrier 72, because a data carrier 72 of this kind may be exposed to relatively high bending stresses.

Figure 4:
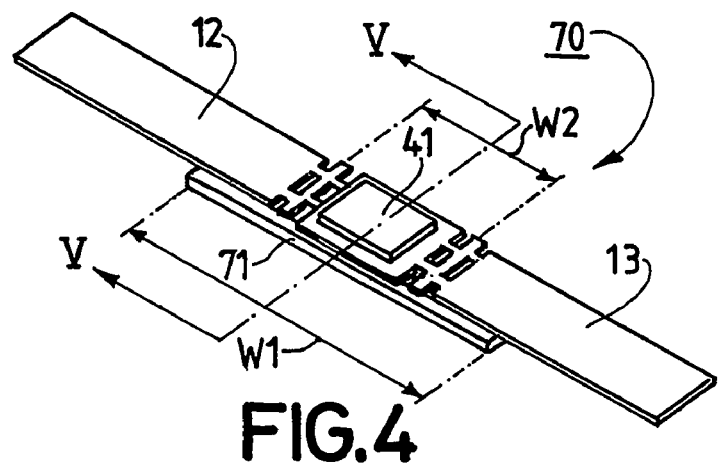
FIG. 4 is an oblique view from above showing a module according to one embodiment of the invention, which has been produced with the help of a lead-frame configuration as shown in FIG. 3.

As can be seen from FIG. 4, in the case of the module 70 the dimension W1 of the reinforcement ribbon 71 is equal to the width of the reinforcement strip 66 on the lead-frame configuration 60. By selecting the dimension W1, a state of affairs is produced where all the apertures that are provided adjacent to the chip 41 in the connecting plates 12 and 13 are covered by the reinforcement ribbon 71. In a variant version of the module 70, the reinforcement ribbon 71 may also be of a different dimension, namely a dimension W2, as indicated in FIG. 4. What is achieved in this way is that the apertures that are provided in the connecting plates 12 and 13 outside the dimension W2 are not covered by the reinforcement ribbon 71. This has the advantage that the apertures that are provided outside the dimension W2, which are provided for the purposes of strain relief, are not restricted in respect of the action they perform for the purposes of strain relief.

What is also shown in FIG. 5 at the same time as the module 70 described above is an advantageous further embodiment of a module 70 of this kind. In this further embodiment of the module 70, there are provided on the fiber-reinforced film of plastics material that is intended to act as a reinforcement ribbon 71 three further layers 74, 75 and 76. The first further layer 74 is a protective layer 74 that is composed of metal. The second further layer 75 is a damping layer 75 that is composed of a damping material, a paper-like material being selected as a damping material in the present case. A rubber-like material may however also be used. The third further layer 76 is a fastening layer 76 that is composed of a fastening material, an adhesive material being selected as the fastening material in the present case.

The protective layer 74 composed of metal is produced by a vapor deposition process and has a thickness of approximately 100 nm. The protective layer 74 acts as a barrier against moisture and also acts as a light-screen against ultraviolet radiation and infrared radiation and acts in addition as protection against radio-frequency waves.

The damping layer 75 has the advantage that, during the further processing to which the advantageous further embodiment of the module 70 is subjected to allow a data carrier 72 to be manufactured, it damps the pressure on the chip 41 that occurs in the course of this, for example, in a lamination process and thus appreciably reduces the risk of a chip fracture.

The fastening layer 76 can be used to enable the advantageous refinement of the module 70 to be provisionally held fast on a carrier film that is provided with a transmission coil, after which an electrically conductive connection is made between the connecting plates 12 and 13 and two coil connecting contacts of the transmission coil, for example, by a crimping operation or by means of an electrically conductive adhesive or by a soldering process or a welding process, after which the carrier film provided with the transmission coil plus the module which is provisionally held firm on it by means of the fastening layer 76 is connected to other films in a laminating process and the complete data carrier 72 is produced in this way. The fastening layer 76 may be composed of an electrically insulating material, which has the advantage that, to allow the module 70 or rather its two connecting plates 12 and 13 to be connected to two coil connecting contacts of a transmission coil, the module 70 can be positioned transversely over the turns of the transmission coil without this causing a short-circuit between the turns of the coil.

It should be mentioned at this point that in other advantageous further embodiments of the module 70, it is also possible for only one or only two of the three layers 74, 75 and 76 described above to be provided on the reinforcement ribbon 71. Layers of other forms may also be provided for other intended uses.

The invention claimed is:

1. A lead-frame configuration that is in the form of a lead-frame strip, that has a frame base and that has a plurality of lead-frames that are connected to the frame base and that are situated next to one another in the longitudinal direction of the lead-frame strip, each of which lead-frames is intended to receive a chip wherein, each lead-frame has at least two connecting plates wherein there is provided for the lead-frames that are situated next to one another in the longitudinal direction of the lead-frame strip a reinforcement strip that extends in the longitudinal direction of the lead-frame strip and is connected both to the frame base and to the connecting plates of each of the lead-frames that are situated next to one another in the longitudinal direction of the lead-frame strip, the connection being made by means of a layer of adhesive, wherein the reinforcement strip is formed by a fiber-reinforced film of plastics material and wherein the layer of adhesive is produced by means of an adhesive that is suitable for transmitting shear forces that may occur in the region between the connecting plates on the one hand and the reinforcement strip on the other hand.

2. A lead-frame configuration as claimed in claim 1, wherein at least one further layer is provided on the reinforcement strip formed by a fiber-reinforced film of plastics material.

3. A lead-frame configuration as claimed in claim 2, wherein at least one further layer is provided on the reinforcement strip formed by a fiber-reinforced film of plastics material, which at least one further layer belongs to the group of layers detailed below, which group comprises: a protective layer that is composed of metal, a damping layer that is composed of a damping material, and a fastening layer that is composed of a fastening material.

4. A module that is produced with the help of a lead-frame configuration and that has at least two connecting plates each of which is connected to a connecting contact of a chip, and that has a reinforcement ribbon that is connected to the connecting plates, the connection between the reinforcement ribbon and the connecting plates being made by means of a layer of adhesive, wherein the reinforcement ribbon is formed by a fiber-reinforced film of plastics material and wherein the layer of adhesive is produced by means of an adhesive that is suitable for transmitting shear forces that may occur in the region between the connecting plates on the one hand and the reinforcement ribbon on the other hand.

5. A module as claimed in claim 4, wherein at least one further layer is provided on the reinforcement ribbon formed by a fiber-reinforced film of plastics material.

6. A module as claimed in claim 5, wherein at least one further layer is provided on the reinforcement ribbon formed by a fiber-reinforced film of plastics material, which at least one further layer belongs to the group of layers detailed below, which group comprises: a protective layer that is composed of metal, a damping layer that is composed of a damping material, and a fastening layer that is composed of a fastening material.

7. A data carrier, wherein the data carrier contains a module as claimed in claim 4.

8. The module of claim 6 wherein the fastening material is an adhesive material.

9. The lead-frame configuration of claim 3 wherein the fastening material is an adhesive material.

10. A lead-frame configuration that is in the form of a lead-frame strip, that has a frame base and that has a plurality of lead-frames that are connected to the frame base and that are situated next to one another in the longitudinal direction of the lead-frame strip, each of which lead-frames is intended to receive a chip wherein, each lead-frame has at least two connecting plates wherein there is provided for the lead-frames that are situated next to one another in the longitudinal direction of the lead-frame strip a reinforcement strip that extends in the longitudinal direction of the lead-frame strip and is connected both to the frame base and to the connecting plates of each of the lead-frames that are situated next to one another in the longitudinal direction of the lead-frame strip.

11. The lead-frame configuration of claim 10 wherein the connection between the connecting plates and the reinforcement strip is made by means of a layer of adhesive.

12. The lead-frame configuration of claim 11 wherein the reinforcement strip is formed by a fiber-reinforced film of plastics material and wherein the layer of adhesive is produced by means of an adhesive that is suitable for transmitting shear forces that may occur in the region between the connecting plates on the one hand and the reinforcement strip on the other hand.

13. A lead-frame configuration as claimed in claim 12, wherein at least one farther layer is provided on the reinforcement strip formed by a fiber-reinforced film of plastics material.

14. A lead-frame configuration as claimed in claim 13, wherein at least one farther layer is provided on the reinforcement strip formed by a fiber-reinforced film of plastics material, which at least one further layer belongs to the group of layers detailed below, which group comprises: a protective layer that is composed of metal, a damping layer that is composed of a damping material, and a fastening layer that is composed of a fastening material.

* * * * *